(12) United States Patent
Bettencourt et al.

(10) Patent No.: US 8,268,117 B2
(45) Date of Patent: *Sep. 18, 2012

(54) SHOWERHEAD ELECTRODES

(75) Inventors: Greg Bettencourt, Fremont, CA (US);
Raj Dhindsa, San Jose, CA (US);
George Diercks, Washington Township, OH (US); Randall A. Hardin, Miamisburg, OH (US); Jon Keihl, Versailles, OH (US); Duane Lytle, Vandalia, OH (US); Alexei Marakhtanov, Albany, CA (US); Roger Patrick, Mountain View, CA (US); John Pegg, Englewood, OH (US); Shannon Spencer, Huber Heights, OH (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/409,527

(22) Filed: Mar. 1, 2012

(65) Prior Publication Data

US 2012/0160941 A1 Jun. 28, 2012

Related U.S. Application Data

(63) Continuation of application No. 11/871,586, filed on Oct. 12, 2007, now Pat. No. 8,152,954.

(51) Int. Cl.
*C23F 1/00* (2006.01)
*H01L 21/306* (2006.01)

(52) U.S. Cl. .............................. 156/345.34; 156/345.33

(58) Field of Classification Search ............. 156/345.34, 156/345.33
See application file for complete search history.

(56) References Cited

U.S. PATENT DOCUMENTS

| 3,783,173 | A | 1/1974 | Twomey |
| 4,595,484 | A | 6/1986 | Giammarco et al. |
| 4,654,754 | A | 3/1987 | Daszkowski |
| 4,782,893 | A | 11/1988 | Thomas |
| 4,792,378 | A | 12/1988 | Rose et al. |
| 4,820,371 | A | 4/1989 | Rose |
| 4,960,488 | A | 10/1990 | Law et al. |
| 5,518,758 | A | 5/1996 | Tirburtius et al. |
| 5,534,751 | A | 7/1996 | Lenz et al. |
| 5,545,473 | A | 8/1996 | Ameen et al. |
| 5,660,917 | A | 8/1997 | Fujimori et al. |
| 5,679,457 | A | 10/1997 | Bergerson |
| 5,932,007 | A | 8/1999 | Li |

(Continued)

FOREIGN PATENT DOCUMENTS

JP   2007123796 A   5/2007

(Continued)

OTHER PUBLICATIONS

English translation of KR 2005-0043829, Oct. 2, 2006, Choi.

(Continued)

*Primary Examiner* — Keath Chen
(74) *Attorney, Agent, or Firm* — Dinsmore & Shohl LLP

(57) ABSTRACT

A silicon-based showerhead electrode is provided that can include a backside, a frontside, and a plurality of showerhead passages extending from the backside of the silicon-based showerhead electrode to the frontside of the silicon-based showerhead electrode. The silicon-based showerhead electrode can comprise single crystal silicon. The silicon-based showerhead electrode may further include a plurality of partial recesses formed within the single crystal silicon along the backside of the silicon-based showerhead electrode. The plurality of partial recesses can leave a thickness of single crystal silicon between each of the partial recesses and the frontside of the silicon-based showerhead electrode.

17 Claims, 5 Drawing Sheets

U.S. PATENT DOCUMENTS

| | | |
|---|---|---|
| 6,036,782 A | 3/2000 | Tanaka et al. |
| 6,050,216 A | 4/2000 | Szapucki et al. |
| 6,073,577 A | 6/2000 | Lilleland et al. |
| 6,096,414 A | 8/2000 | Young |
| 6,131,646 A | 10/2000 | Kelley |
| 6,165,612 A | 12/2000 | Misra |
| 6,170,432 B1 | 1/2001 | Szapucki et al. |
| 6,200,415 B1 | 3/2001 | Maraschin |
| 6,220,607 B1 | 4/2001 | Schneider et al. |
| 6,331,349 B1 | 12/2001 | Kalinoski et al. |
| 6,343,647 B2 | 2/2002 | Kim et al. |
| 6,365,063 B2 | 4/2002 | Collins et al. |
| 6,376,385 B2 | 4/2002 | Lilleland et al. |
| 6,379,491 B1 | 4/2002 | Lee et al. |
| 6,412,437 B1 | 7/2002 | Campbell et al. |
| 6,432,831 B2 | 8/2002 | Dhindsa et al. |
| 6,468,925 B2 | 10/2002 | Campbell et al. |
| 6,475,933 B1 | 11/2002 | Brown et al. |
| 6,491,784 B2 | 12/2002 | Yamaguchi et al. |
| 6,496,373 B1 | 12/2002 | Chung |
| 6,651,736 B2 | 11/2003 | Chiu et al. |
| 6,733,015 B2 | 5/2004 | Forry et al. |
| 6,786,175 B2 | 9/2004 | Dhindsa et al. |
| 6,818,097 B2 | 11/2004 | Yamaguchi et al. |
| 6,824,627 B2 | 11/2004 | Dhindsa et al. |
| 6,855,377 B2 | 2/2005 | Yajima et al. |
| 6,983,892 B2 | 1/2006 | Noorbakhsh et al. |
| 7,017,269 B2 | 3/2006 | White et al. |
| 7,018,506 B2 | 3/2006 | Hongoh et al. |
| 7,094,315 B2 | 8/2006 | Chen et al. |
| 7,137,444 B2 | 11/2006 | Faybishenko et al. |
| 7,159,537 B2 | 1/2007 | Wickramanayaka et al. |
| 7,205,050 B2 | 4/2007 | Haas |
| 7,208,192 B2 | 4/2007 | Bunyan et al. |
| 7,220,937 B2 | 5/2007 | Hofman et al. |
| 2001/0033059 A1 | 10/2001 | Forry et al. |
| 2002/0106610 A1 | 8/2002 | Hurson |
| 2002/0123230 A1 | 9/2002 | Hubacek |
| 2003/0106644 A1 | 6/2003 | Sirkis et al. |
| 2004/0187792 A1 | 9/2004 | Parks |
| 2005/0028935 A1 | 2/2005 | Wickramanayaka et al. |
| 2005/0133160 A1 | 6/2005 | Kennedy et al. |
| 2005/0145336 A1 | 7/2005 | Matsushima et al. |
| 2005/0241765 A1 | 11/2005 | Dhindsa et al. |
| 2005/0241766 A1 | 11/2005 | Dhindsa et al. |
| 2006/0054280 A1 | 3/2006 | Jang |
| 2006/0060138 A1 | 3/2006 | Keller et al. |
| 2006/0137607 A1 | 6/2006 | Seo et al. |
| 2006/0207502 A1 | 9/2006 | Dhindsa et al. |
| 2006/0253942 A1 | 11/2006 | Barrera et al. |
| 2006/0266852 A1 | 11/2006 | Choi |
| 2007/0068629 A1 | 3/2007 | Shih et al. |
| 2007/0187038 A1 | 8/2007 | Ren et al. |
| 2008/0090417 A1 | 4/2008 | De La Llera et al. |
| 2008/0255294 A1 | 10/2008 | Yerushalmi-Rozen |

FOREIGN PATENT DOCUMENTS

| | | |
|---|---|---|
| JP | 2008103589 A | 5/2008 |
| KR | 20040007301 A | 1/2004 |
| KR | 2005-0043829 B1 | 10/2006 |
| KR | 1020070015599 A | 3/2007 |
| WO | 2005065186 A2 | 7/2005 |

OTHER PUBLICATIONS

International Search Report and Written Opinion dated Jan. 9, 2009 pertaining to International application No. PCT/US2008/075676 filed Sep. 9, 2008.

International Search Report and Written Opinion dated Nov. 28, 2008 pertaining to International application No. PCT/US2008/064488.

Glasgow et al., "Performance Testing of Thermal Interface Filler Materials in a Bolted Aluminum Interface Under Thermal/Vacuum Conditions", National Aeronautics and Space Administration, Jun. 2003.

The Berquist Company, "Thermal Materials: Sil-Pad Products", http://www/berquistcompany.com/tn_sil_pad-print.cfm?98d+1-4294, Jun. 13, 2007.

International Search Report and Written Opinion dated Aug. 27, 2009 pertaining to International application No. PCT/US2009/033060.

U.S. Appl. No. 12/050,195, filed Mar. 18, 2008.

U.S. Appl. No. 12/112,112, filed Apr. 30, 2008.

U.S. Appl. No. 12/409,984, filed Mar. 24, 2009.

U.S. Final Office Action dated Dec. 21, 2010 pertaining to U.S. Appl. No. 12/112,112.

U.S. Final Office Action dated Dec. 21, 2010 pertaining to U.S. Appl. No. 12/050,195.

International Search Report and Written Opinion dated Oct. 6, 2010 pertaining to International application No. PCT/US2010/027273.

U.S. Office Action dated Aug. 25, 2010 pertaining to U.S. Appl. No. 12/050,195.

U.S. Office Action dated Aug. 31, 2010 pertaining to U.S. Appl. No. 12/112,112.

Douglas R. McCarter et al., "Design and Fabrication of a Single Crystal Silicon (SCSi) Telescope: a Success Story", (Proceedings Paper) in Optical Materials and Structures Technologies 111 6666 (William A. Goodman and Joseph Robichaud eds., Sep. 17, 2007.

U.S. Non-Final Office Action dated Sep. 22, 2011 pertaining to U.S. Appl. No. 12/050,195.

Office Action mailed Sep. 21, 2011 as it relates to U.S. Appl. No. 12/112,112.

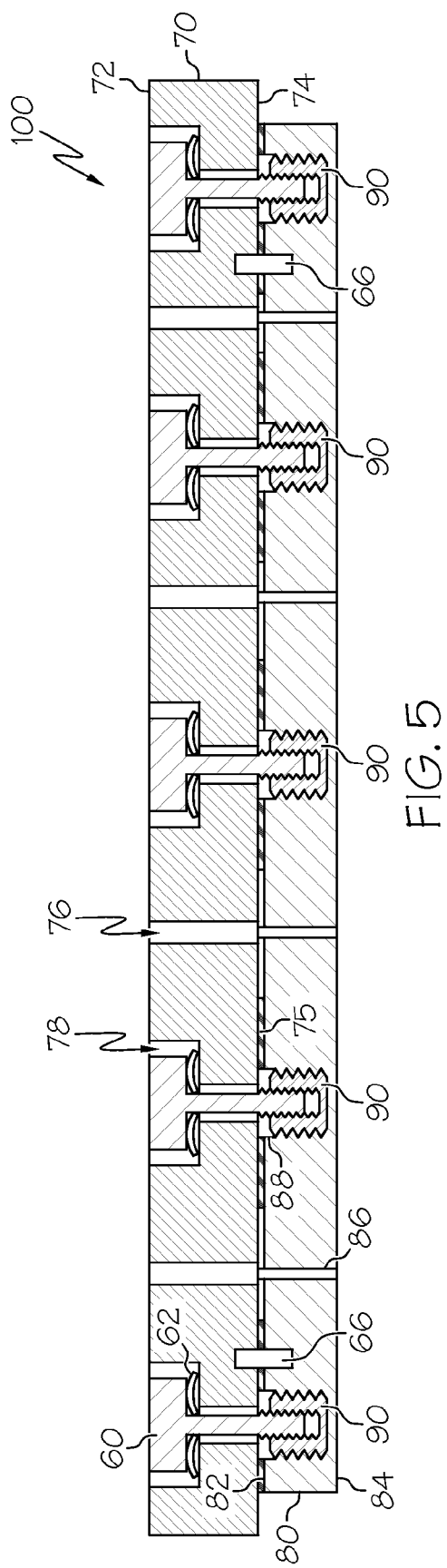
FIG. 5
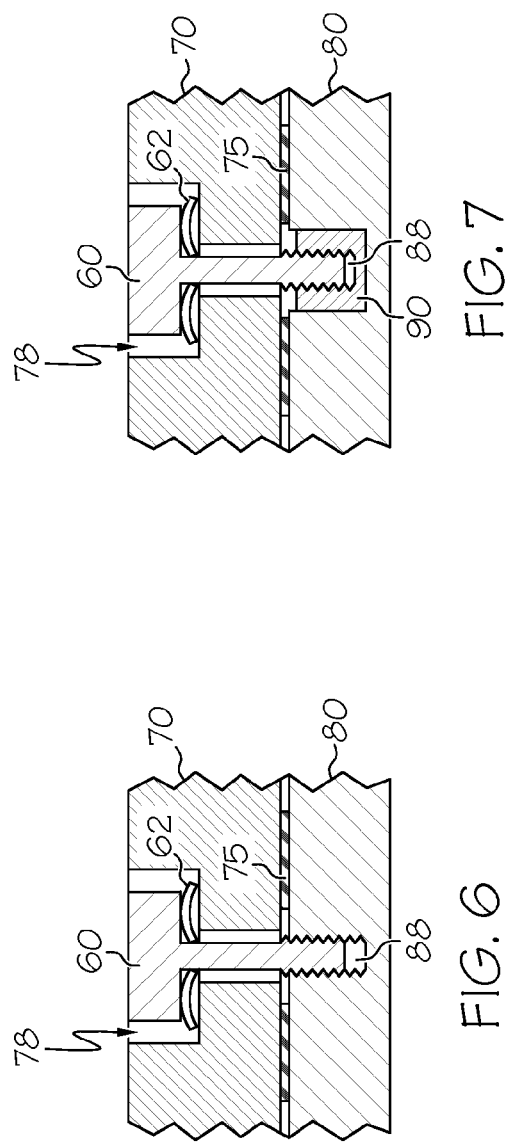
FIG. 6
FIG. 7

US 8,268,117 B2

SHOWERHEAD ELECTRODES

CROSS-REFERENCE TO RELATED APPLICATIONS

This application is a continuation of U.S. application Ser. No. 11/871,586, filed Oct. 12, 2007, now U.S. Pat. No. 8,152, 954, entitled "SHOWERHEAD ELECTRODE ASSEMBLIES AND PLASMA PROCESSING CHAMBERS INCORPORATING THE SAME." This application is related to but does not claim priority to U.S. application Ser. No. 12/409,984, filed Mar. 24, 2009, entitled "ANCHORING INSERTS, ELECTRODE ASSEMBLIES, AND PLASMA PROCESSING CHAMBERS"; U.S. application Ser. No. 12/112,112, filed Apr. 30, 2008, entitled "ELECTRODE ASSEMBLY AND PLASMA PROCESSING CHAMBER UTILIZING THERMALLY CONDUCTIVE GASKET AND O-RING", and U.S. application Ser. No. 12/050,195, filed Mar. 18, 2008, entitled "ELECTRODE ASSEMBLY AND PLASMA PROCESSING CHAMBER UTILIZING THERMALLY CONDUCTIVE GASKET".

BACKGROUND

The present invention relates generally to plasma processing and, more particularly, to plasma processing chambers and electrode assemblies used therein. Plasma processing apparatuses can be used to process substrates by a variety of techniques including, but not limited to, etching, physical vapor deposition, chemical vapor deposition, ion implantation, resist removal, etc. For example, and not by way of limitation, one type of plasma processing chamber contains an upper electrode, commonly referred to as a showerhead electrode, and a bottom electrode. An electric field is established between the electrodes to excite a process gas into the plasma state to process substrates in the reaction chamber.

BRIEF SUMMARY

According to one embodiment of the present invention, a silicon-based showerhead electrode is provided that can include a backside, a frontside, and a plurality of showerhead passages extending from the backside of the silicon-based showerhead electrode to the frontside of the silicon-based showerhead electrode. The silicon-based showerhead electrode can comprise single crystal silicon. The silicon-based showerhead electrode may further include a plurality of partial recesses formed within the single crystal silicon along the backside of the silicon-based showerhead electrode. The plurality of partial recesses can leave a thickness of single crystal silicon between each of the partial recesses and the frontside of the silicon-based showerhead electrode.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which:

FIG. 5 is a cross sectional illustration of an electrode assembly including securing hardware according to one embodiment of the present invention;

FIGS. 6, 7, 8A, and 9 are cross sectional illustrations of a portion of an electrode assembly including securing hardware according to some alternative embodiments of the present invention;

DETAILED DESCRIPTION

Figure 1:
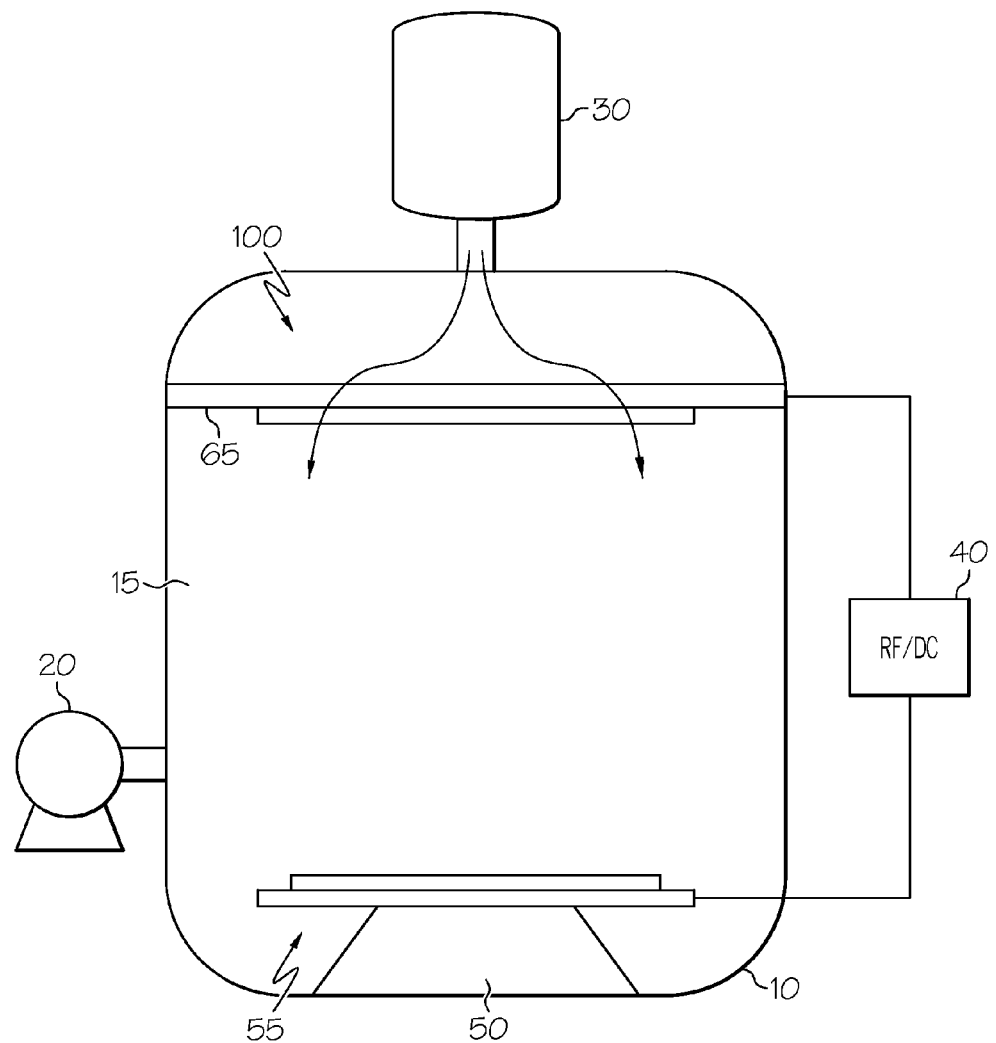
FIG. 1 is a schematic illustration of a plasma processing chamber incorporating particular aspects of some embodiments of the present invention.
Figure 2:
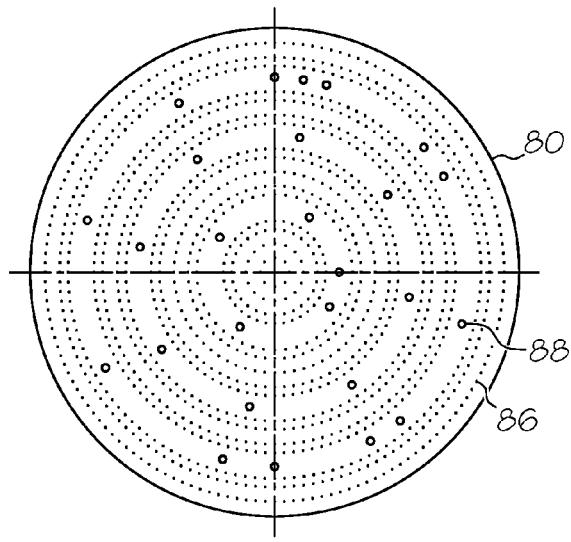
FIG. 2 is a plan view of the backside of a showerhead electrode according to one embodiment of the present invention.
Figure 3:
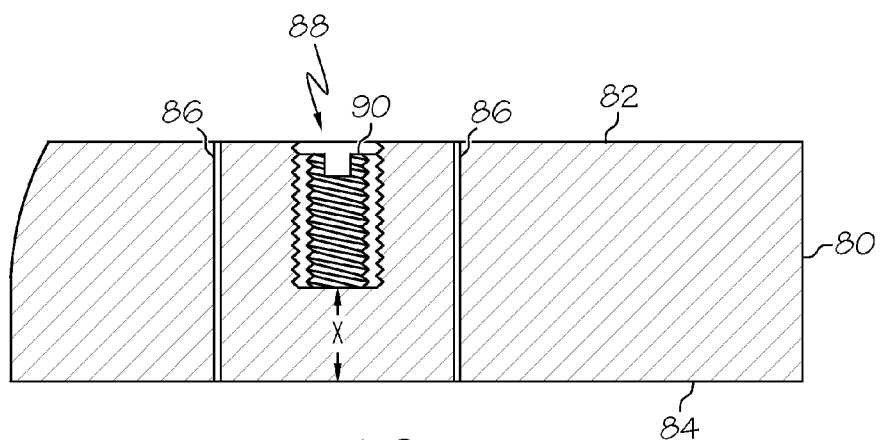
FIG. 3 is a cross-sectional illustration of a portion of a showerhead electrode according to one embodiment of the present invention.
Figure 4:
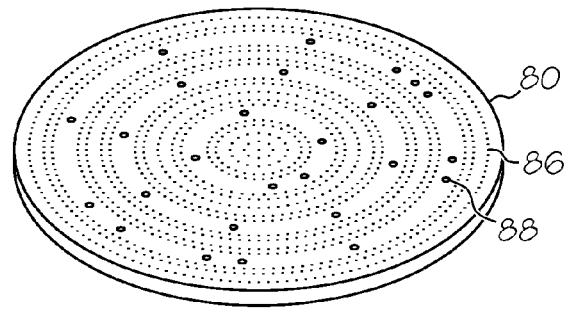
FIG. 4 is an isometric illustration of the backside and thickness dimensions of a showerhead electrode according to one embodiment of the present invention.
Figure 8A:
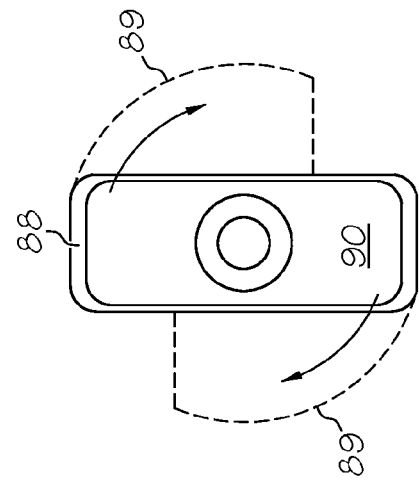
Figure 8B:
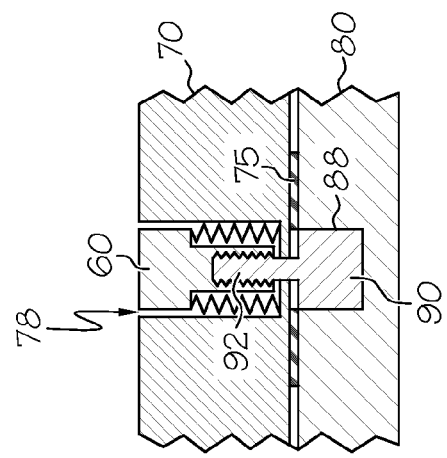
FIGS. 8B and 8C are schematic illustrations presented to clarify the structure and operation of the subject matter illustrated in FIG. 8A.
Figure 8C:
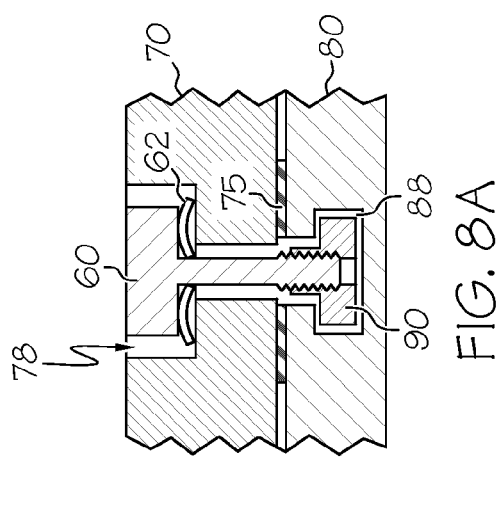

The various aspects of the present invention can be illustrated in the context of a plasma processing chamber 10, which is merely illustrated schematically in FIG. 1 to avoid limitation of the concepts of the present invention to particular plasma processing configurations, or components, that may not be integral to the subject matter of the present invention. As is generally illustrated in FIG. 1, the plasma processing chamber 10 comprises a vacuum source 20, a process gas supply 30, a plasma power supply 40, a substrate support 50 including a lower electrode assembly 55, and an upper electrode assembly 100.

Referring to FIGS. 2-5, an upper electrode assembly 100 according to one embodiment of the present invention is illustrated. Generally, the electrode assembly 100 comprises securing hardware 60, alignment pins 66, a thermal control plate 70, a silicon-based showerhead electrode 80, and a thermally conductive gasket 75 positioned between the frontside 74 of the thermal control plate 70 and the backside 82 of the silicon-based showerhead electrode 80. More specifically, the thermal control plate 70 comprises a backside 72, a frontside 74, and one or more process gas passages 76 configured to direct process gas to the frontside 74 of the thermal control plate 70. Although the present invention is not limited to particular thermal control plate materials or process gas passage configurations, it is noted that suitable thermal control plate materials include aluminum, aluminum alloys, or similar thermal conductors. In addition, it is noted that a variety of teachings may be relied upon in the design of thermal control plates including, but not limited to, U.S. Pub. No. 2005/0133160.

The silicon-based showerhead electrode 80 comprises a backside 82, a frontside 84, and a plurality of showerhead passages 86 extending from the backside 82 of the silicon-based showerhead electrode 80 to the frontside 84 of the silicon-based showerhead electrode 80. The silicon-based showerhead electrode 80 further comprises a plurality of partial recesses 88 formed in the backside 82 of the electrode 80. As is illustrated in FIG. 5, the partial recesses 88 leave a thickness x of silicon-based electrode material between the recess 88 and the frontside 84 of the electrode 80. Backside inserts 90 are positioned in the partial recesses along the backside 82 of the electrode 80. The silicon-based electrode material between the recess 88 and the frontside 84 of the showerhead electrode 80 helps minimize potential source of contamination in the plasma processing chamber 10 by isolating the backside inserts 90 and the securing hardware 60 from reactive species in the plasma chamber. To help ensure that the aforementioned isolation can be maintained over the life of the electrode 80, the thickness x is preferably at least approximately 0.25 cm or, stated differently, at least approximately 25% of the total thickness of the silicon-based showerhead electrode 80.

Referring to FIG. 1, this isolation can be enhanced by configuring the thermal control plate 70 and the silicon-based showerhead electrode 80 to define a hermetically sealed plasma partition 65 such that gas and reactive species within the evacuated portion 15 of the plasma processing chamber 10 cannot reach the securing hardware 60 and the inserts. The particular manner in which the plasma partition 65 is defined will vary depending on the respective configurations of the thermal control plate 70 and the showerhead electrode 80. It is contemplated that in most cases, the respective materials forming the thermal control plate 70 and the showerhead electrode 80 will define the majority of the partition. In addition, it is contemplated that a variety of sealing members can be used to enhance the partition, particularly where the thermal control plate 70 and the showerhead electrode 80 interface with each other and with other components of the plasma processing chamber 10.

Referring to FIG. 5, the aforementioned isolation of the backside inserts 90 and the securing hardware 60 from reactive species in the plasma chamber 10 can be further enhanced by positioning the backside inserts 90 in the partial recesses 88 such that they are inset or, at least, flush relative to the backside 82 of the silicon-based showerhead electrode 80. Similarly, the securing hardware 60 can be positioned in securing hardware passages 78 in the thermal control plate 70 such that it is inset or, at least, flush relative to a backside 72 of the thermal control plate 70.

In addition to the process gas passages 76, the thermal control plate 70 comprises securing hardware passages 78 that are configured to permit securing hardware 60 to access the backside inserts 90 positioned in the partial recesses 88 along the backside 82 of the silicon-based showerhead electrode 80. The thermal control plate 70 and the silicon-based showerhead electrode 80 can be engaged using the securing hardware 60 and the backside inserts 90. In the engaged state, the frontside 74 of the thermal control plate 70 faces the backside 82 of the silicon-based showerhead electrode 80 and the showerhead passages 86 in the silicon-based showerhead electrode 80 are aligned with the process gas passages 76 in the thermal control plate 70. In addition, the securing hardware passages 78 are aligned with the backside inserts 90 positioned in the partial recesses 88 along the backside 82 of the electrode 80. As a result, the securing hardware 60 may extend through the securing hardware passages 78 in the thermal control plate 70 and engage the backside inserts 90, which are positioned in the partial recesses 88 along the backside 82 of the electrode 80.

The securing hardware 60 and the backside inserts 90 are configured to maintain engagement of the thermal control plate 70 and the silicon-based showerhead electrode 80. In addition, the securing hardware 60 and the backside inserts 90 are configured to permit disengagement of the thermal control plate 80 and the showerhead electrode 80. In the embodiment illustrated in FIG. 5, and other embodiments described herein, the silicon-based electrode material of the silicon-based showerhead electrode 80 is isolated from frictional contact with the securing hardware 60 by the relatively resilient material of the backside inserts 90 during engagement and disengagement. This isolation, provided by the backside inserts 90, serves to eliminate abrasion of the silicon-based electrode material by the securing hardware 60 as a source of contamination in the plasma chamber 10. The resiliency of the backside inserts 90 also permit repeated, nondestructive engagement and disengagement of the thermal control plate 70 and the silicon-based showerhead electrode 80.

Although a variety of materials may be selected to form the backside inserts 90, including thermoplastics or other kinds of plastics, synthetic rubbers, ceramics, metals, or inserts with composite layers of materials, according to some embodiments of the present invention, the backside inserts comprise significant amounts of polyetheretherketone (PEEK) formulated and manufactured such that the hardness of the backside inserts 90 does not exceed the hardness of the silicon-based electrode material. Additional candidate materials include, but are not limited to Delrin® or other acetal resin engineering plastics formulated as filled or unfilled homopolymers or copolymers, nylon, polytetrafluoroethylene (PTFE), or combinations thereof.

Although the thermal control plate 70 and the silicon-based showerhead electrode 80 can be engaged in a variety of ways consistent with the concepts of the present invention, in the embodiments illustrated in FIGS. 5, and 7-11, the backside inserts 90 can be configured as anchors in the partial recesses 88 formed in the backside 82 of the silicon-based showerhead electrode 80. More specifically, in the embodiment of FIG. 5, the backside insert 90 is anchored in the partial recess by providing a threaded portion in the silicon-based electrode material. With the insert 90 in place, the securing hardware 60, which may for example comprise a threaded screw or bolt, engages the backside insert 90 to secure the showerhead electrode 80 to the thermal control plate 70. In the embodiment of FIG. 7, the backside insert is anchored in the partial recess via a bonding agent. In the embodiment illustrated in FIGS. 8A-8C, the partial recess 88 is machined to comprise an undercut portion 89 and the backside insert 90 is anchored in the partial recess 88 by inserting the insert 90 into the recess 88 and rotating it into the undercut portion 89 of the partial recess 88.

Figure 9:
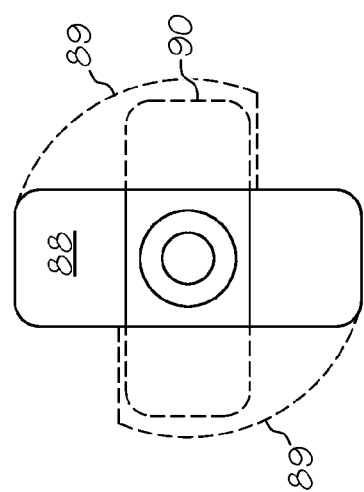

Referring to FIG. 9, it is noted that the backside insert 90 can be configured as a stud comprising a backside extension 92 that is configured to extend into one of the securing hardware passages 78 in the thermal control plate 70. In which case, the securing hardware 60 is configured to access the backside extension 92 of the backside insert 90 in the securing hardware passage 78 via, for example, a threaded engagement.

In any of the embodiments disclosed herein employing one or more backside inserts 90, it will often be advantageous to ensure that the securing hardware 60, the backside inserts 90, and the partial recess 88 are configured such that, during thermal loading, with the securing hardware 60 and backside insert 90 in an engaged state, the backside insert is able to move with the securing hardware within the partial recess without dislodging from the recess. For example, referring to the embodiment of the present invention illustrated in FIGS. 10-11, where a refinement of the undercut embodiment illustrated above with reference to FIGS. 8A-8C is illustrated, the backside insert 90 is provided with tabs 95 that are configured to complement the undercut portions 89 formed in the electrode material of the showerhead electrode 80. The insert 90 can be secured in the recess 88 by aligning the tabs 95 with the corresponding grooves 85 in the electrode 80, inserting the insert 90 in the recess 88, and rotating the insert 90, as defined by the grooves 85.

Figure 10:
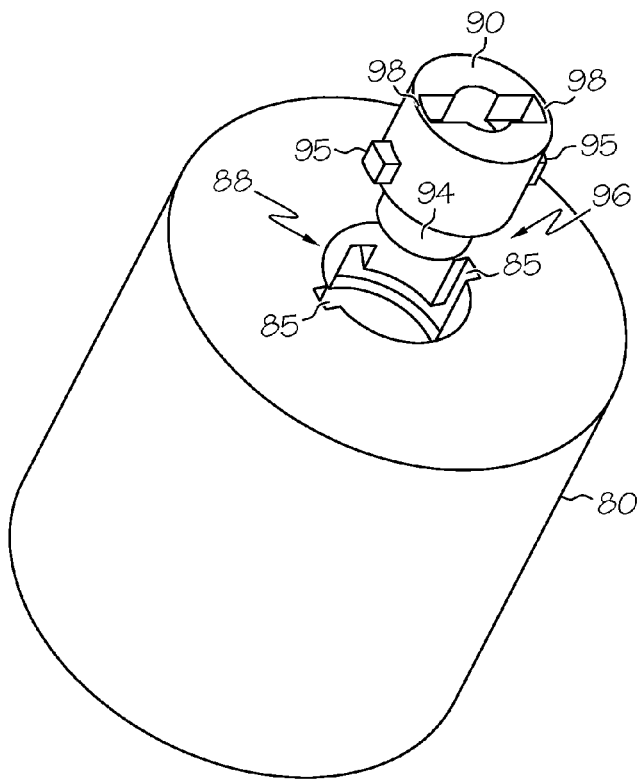
FIGS. 10 and 11 illustrate securing hardware and complementary machined portions of an electrode assembly according to a further alternative embodiment of the present invention.
Figure 11:
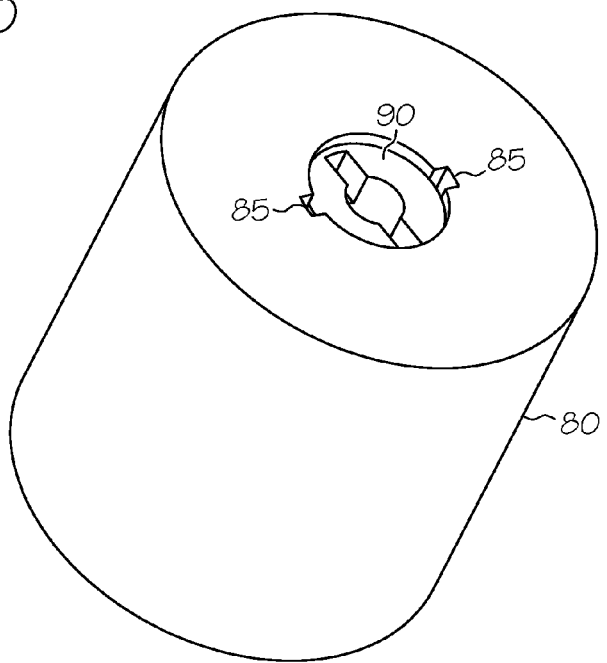

In the embodiment of FIGS. 10 and 11, the insert 90 can be secured in the recess 88 in a spring-loaded state by providing a spring about a reduced diameter portion 94 of the buried end 96 of the insert 90 and the outside diametrical dimensions of the insert 90 and the size and shape of the tabs 95 are chosen to allow for movement of the insert 90 in the partial recess 88 in the spring-loaded state. As a result, during the thermal loading typically present in plasma processing, the backside insert 90 can move with the securing hardware 60 within the partial recess 88 without dislodging from the recess 88 and without degrading the engagement of the securing hardware 60 and the insert 90.

The present inventors have recognized that any abrasive contact with the electrode material in the vicinity of the recesses 88 can create a source of potential contamination in the plasma processing chamber 10. Accordingly, where a backside insert 90 according to the present invention is configured for installation or removal with a screwdriver or other potentially abrasive tool, as is the case in the embodiment of FIGS. 10-11, it is contemplated that the slotted driving head of the backside insert 90 can be provided with lateral shielding portions 98 at the edges of the slot or other engaging portion with which the removal tool is to mate. Stated more generally, the backside insert 90 may comprise one or more lateral shielding portions 98 configured to permit a tool to engage the backside insert at a tool engaging portion thereof without extending beyond the periphery of the insert where it could come into contact with the inside diameter of the recess in the electrode material.

A variety of spring-loaded configurations can be utilized to reduce any tendency of the securing hardware 60 to become disengaged as a result of stress induced as a result of thermal loading induced during plasma processing. For example, one configuration for providing a spring-loaded engagement of the thermal control plate 70 and the silicon-based showerhead electrode 80 is illustrated in FIGS. 5-7. In FIGS. 5 and 7, the backside insert 90 is configured as an anchor in one of the partial recesses 88 formed in the backside 82 of the showerhead electrode 80 and the securing hardware 60 comprises a spring element in the form of a spring-loaded washer 62 configured to oppose a force of engagement provided when the securing hardware 60 accesses the backside insert 90. In FIG. 6, the backside insert is omitted in favor of direct threaded engagement with a tapped hole in the electrode material. Alternatively, as is illustrated in FIG. 9, the spring element can be provided as a helical spring 64 arranged about a longitudinal extension of the securing hardware 60 in the securing hardware passage 78.

Although the various concepts of the present invention have been described herein in the context of silicon-based electrode materials such as single crystal silicon, polysilicon, silicon nitride, and silicon carbide, it is noted that the present invention has utility in a variety of contexts, including those where the silicon-based electrode material comprises boron carbide, aluminum nitride, aluminum oxide, or combinations thereof. In addition, it is contemplated that the silicon-based showerhead electrode 80 may be presented in a variety of configurations without departing from the scope of the present invention including, but not limited to, a single-piece, circular showerhead configurations or multi-component, circular showerhead configurations comprising a circular central electrode and one or more peripheral electrodes arranged about the circumference of the central electrode.

It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present invention or to emphasize alternative or additional features that may or may not be utilized in a particular embodiment of the present invention.

For the purposes of describing and defining the present invention it is noted that the term "approximately" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the open-ended preamble term "comprising."

What is claimed is:

1. A silicon-based showerhead electrode comprising:
   a backside, a frontside, and a plurality of showerhead passages extending from the backside of the silicon-based showerhead electrode to the frontside of the silicon-based showerhead electrode wherein the silicon-based showerhead electrode comprises single crystal silicon; and
   a plurality of partial recesses formed within the single crystal silicon along the backside of the silicon-based showerhead electrode, the plurality of partial recesses leaving a thickness of single crystal silicon between each of the plurality of partial recesses and the frontside of the silicon-based showerhead electrode.

2. A silicon-based showerhead electrode as claimed in claim 1 wherein the silicon-based showerhead electrode further comprises a backside insert positioned in one of the plurality of partial recesses along the backside of the silicon-based showerhead electrode.

3. A silicon-based showerhead electrode as claimed in claim 2 wherein the hardness of the backside insert does not exceed the hardness of the single crystal silicon.

4. A silicon-based showerhead electrode as claimed in claim 2 wherein the backside insert comprises polyetheretherketone (PEEK) formulated and manufactured such that the hardness of the backside insert does not exceed the hardness of the single crystal silicon.

5. A silicon-based showerhead electrode as claimed in claim 2 wherein the backside insert is positioned in one of the plurality of partial recesses such that the backside insert is inset relative to the backside of the silicon-based showerhead electrode.

6. A silicon-based showerhead electrode as claimed in claim 2 wherein the backside insert comprise a tool engaging portion and one or more lateral shielding portions configured to permit a tool to engage the backside insert without extending beyond the periphery of the backside insert.

7. A silicon-based showerhead electrode as claimed in claim 2 wherein the backside insert is an anchor in one of the plurality of partial recesses formed in the backside of the silicon-based showerhead electrode.

8. A silicon-based showerhead electrode as claimed in claim 7 wherein the backside insert comprises tabs that complement undercut portions formed in the single crystal silicon in an insert and rotate manner.

9. A silicon-based showerhead electrode as claimed in claim 8 wherein the backside insert is secured in one of the plurality of partial recesses in a spring-loaded state.

10. A silicon-based showerhead electrode as claimed in claim 9 wherein the outside diametrical dimensions of the backside insert and the size and shape of the tabs allow for movement of the backside insert in one of the plurality of partial recesses in the spring-loaded state.

11. A silicon-based showerhead electrode as claimed in claim 7 wherein the backside insert is anchored in one of the plurality of partial recesses by a threaded portion formed in the single crystal silicon.

12. A silicon-based showerhead electrode as claimed in claim 7 wherein one of the plurality of partial recesses comprises an undercut portion and the backside insert is anchored in one of the plurality of partial recesses such that the backside insert at least partially extends into the undercut portion of one of the plurality of partial recesses.

13. A silicon-based showerhead electrode as claimed in claim 7 wherein the backside insert is a stud comprising a backside extension.

14. A silicon-based showerhead electrode as claimed in claim 1 wherein the thickness of the single crystal silicon between each of the plurality of partial recesses and the frontside of the silicon-based showerhead electrode is at least approximately 0.25 cm.

15. A silicon-based showerhead electrode as claimed in claim 1 wherein the thickness of the single crystal silicon between each of the plurality of partial recesses and the frontside of the silicon-based showerhead electrode is at least approximately 25% of the total thickness of the silicon-based showerhead electrode.

16. A silicon-based showerhead electrode as claimed in claim 1 wherein the silicon-based showerhead electrode is a single-piece, circular showerhead.

17. A silicon-based showerhead electrode as claimed in claim 1 wherein the silicon-based showerhead electrode is a multi-component, circular showerhead comprising a circular central electrode and one or more peripheral electrodes arranged about a circumference of the circular central electrode.

* * * * *